(12) United States Patent
Marziale et al.

(10) Patent No.: US 6,239,988 B1
(45) Date of Patent: May 29, 2001

(54) CURRENT SOURCED GATE DRIVER FOR FAST THYRISTORS

(75) Inventors: Michael Marziale, El Sobrante; Robert J. Froelich, Concord, both of CA (US)

(73) Assignee: Siemens Medical Systems, Inc., Iselin, NJ (US)

( * ) Notice: Subject to any disclaimer, the term of this patent is extended or adjusted under 35 U.S.C. 154(b) by 0 days.

(21) Appl. No.: 09/329,009

(22) Filed: Jun. 9, 1999

(51) Int. Cl.[7] ................................................. H02M 3/335
(52) U.S. Cl. ................ 363/16; 363/20; 363/97; 363/65
(58) Field of Search ................... 363/15, 16, 20, 363/95, 97, 125, 128, 65, 71

(56) References Cited

U.S. PATENT DOCUMENTS

| 4,297,594 | 10/1981 | Onda et al. | 307/252 C |
|---|---|---|---|
| 4,356,525 | 10/1982 | Konrumpf et al. | 361/4 |
| 4,535,400 | 8/1985 | Itani | 363/68 |
| 5,438,294 | * 8/1995 | Smith | 327/384 |

FOREIGN PATENT DOCUMENTS

WO88/05978    1/1988   (JP) .

* cited by examiner

*Primary Examiner*—Jessica Han

(57) ABSTRACT

Circuits and methods are described for providing gate drive to a gate terminal of a first switching device. The circuit includes a transformer having a core, a primary winding, and at least one secondary winding. The primary winding of the transformer is for coupling to a power source. The at least one secondary winding is for coupling to the gate terminal of the first switching device. A second switching device is connected in series with the primary winding of the transformer. The second switching device controls conduction of current in the primary winding which causes energy to be stored in the core of the transformer. The second switching device is operable to stop the current from flowing in the primary winding thereby causing a current pulse to be generated in the at least one secondary winding from the energy stored in the core. The current pulse is used for driving the gate terminal of the first switching device.

11 Claims, 3 Drawing Sheets

CURRENT SOURCED GATE DRIVER FOR FAST THYRISTORS

BACKGROUND OF THE INVENTION

The present invention relates to providing gate drive to switching devices. More specifically, the present invention provides a flyback energy storage technique to provide a current pulse with a fast rise time for driving fast semiconductor switching devices.

Certain types of high power semiconductor switching devices require gate drive pulses with very fast rise times for proper operation. For example, a high power pulse thyristor or a silicon controlled rectifier (SCR) may require a 30 amp pulse with a 200 nanosecond rise time. One technique for driving a stack of such devices is described in commonly assigned, copending U.S. patent application Ser. No. 09/007,574 for COMPACT SOLID STATE KLYSTRON POWER SUPPLY filed on Jan. 15, 1998, the entirety of which is incorporated herein by reference for all purposes. In that application, each of the gates of an SCR stack are driven by a corresponding secondary winding of a multiple secondary, single primary pulse transformer.

The "hard switch" approach favored by many in the industry uses a high voltage source which employs a specially crafted ultra-low-inductance storage capacitor and charging supply. When a gate pulse is required, the high voltage supply is switched onto the primary of the gate drive pulse transformer. Unfortunately, the inductance of such a pulse transformer circuit, while relatively small, is typically large enough to necessitate a very high voltage power source on the primary winding which also must be capable of sourcing a lot of current. That is, the bulk inductance of the wires leading to the primary winding from the power source and the combined leakage inductances of the multiple secondary windings reflected back through to the primary are such that a very large amplitude, high current drive must be provided to overcome the effective primary inductance and generate the required amplitude and rise time, i.e., di/dt, on each of the secondary windings.

An example of the power source necessary for driving a stack of pulse thyristors which require 30 amps in 200 ns should be illustrative. Assuming a typical primary lead inductance of 2 $\mu$H and a 1:5 primary-to-secondary turns ratio, a 3000 volt supply able to source 150 amps must be used. Where the number of device gates being driven (and therefore the number of secondary windings) is high, leakage inductances must be taken into account, making the voltage requirement significantly higher.

The disadvantages of such an implementation are well known to those of skill in the art. High voltage power supplies and their associated circuitry require special design considerations, present safety issues, and are typically less reliable and more expensive than their lower voltage counterparts. For example, pulse transformers in such high power applications must be robust, fast, and efficient, making them both bulky and expensive. In addition, stray reactances in such designs contribute to the generation of formidable transients which must be suppressed.

It is therefore desirable to provide improved gate drive circuitry for fast semiconductor devices which employs a relatively low voltage power supply and which is simpler, more reliable, and less expensive than current solutions.

SUMMARY OF THE INVENTION

According to the present invention, a gate drive circuit is provided for fast semiconductor devices which employs a flyback energy storage technique to deliver a large current pulse with a fast rise time to the gates of a stack of such devices. The technique uses a transformer having multiple secondary windings, one connected to each gate being driven. The primary of the transformer is connected in series with a switch which controls the flow of current through the primary from a relatively low voltage source. When the primary switch is closed, current ramps up in the primary winding which is representative of energy being stored in the transformer core. When a gate pulse is needed, the primary switch is opened, and the energy stored in the core of the transformer is commutated to the secondary windings and thus to the gates of the stack of devices. The only thing limiting the di/dt of the secondary current pulses is the leakage inductance of the secondary circuits which can be made to be quite low. According to specific embodiments of the present invention, 30 amp current pulses with 200 ns rise times can be achieved with a 100 volt primary supply.

Moreover, the decay of the current pulse delivered to the device gates can be set by manipulation of the L/R of the secondary winding to accommodate a variety of rep rates and pulse droop requirements. Of course, it will be understood that there is a tradeoff between pulse rise time (di/dt) and the decay rate.

Several of the advantages of the present invention will be immediately apparent to those of skill in the art. For example, a much lower voltage source may be used as compared with previous techniques with all the attendant advantages. That is, the gate drive circuit of the present invention is smaller, cheaper, easier to design (less critical layout), safer, and simpler (more reliable). In addition, the pulse transformer used may employ relatively inefficient and lossy (and therefore less expensive) core materials.

Thus, the present invention provides circuits and methods for providing gate drive to a gate terminal of a first switching device. The circuit includes a transformer having a core, a primary winding, and at least one secondary winding. The primary winding of the transformer is for coupling to a power source. The at least one secondary winding is for coupling to the gate terminal of the first switching device. A second switching device is connected in series with the primary winding of the transformer. The second switching device controls conduction of current in the primary winding which causes energy to be stored in the core of the transformer. The second switching device is operable to stop the current from flowing in the primary winding thereby causing a current pulse to be generated in the at least one secondary winding from the energy stored in the core. The current pulse is used for driving the gate terminal of the first switching device.

A further understanding of the nature and advantages of the present invention may be realized by reference to the remaining portions of the specification and the drawings.

DETAILED DESCRIPTION OF SPECIFIC EMBODIMENTS

Figure 1:
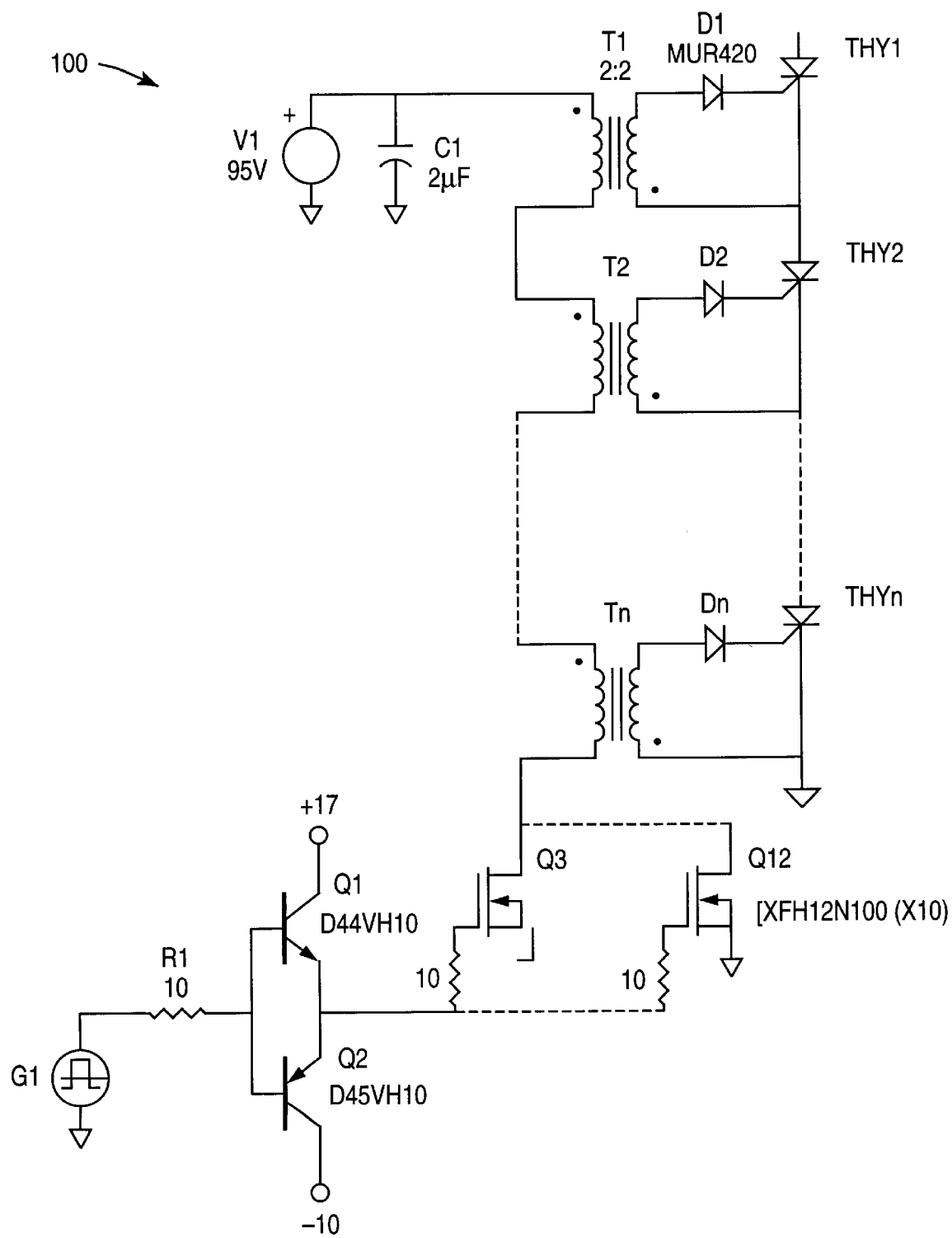
FIG. 1 is a schematic of a gate drive circuit designed according to a specific embodiment of the invention.

FIG. 1 is a schematic of a gate drive circuit 100 designed according to a specific embodiment of the invention for driving the gates of a stack of pulse thyristors THY1 through THYn. Gate drive circuit 100 is built around a plurality of pulse transformers (represented by T1 through Tn) each having a primary winding and a secondary winding, and each of which is connected to a corresponding one of the gates of thyristors THY1 through THYn through one of fast recovery diodes D1 through Dn. According to a specific embodiment, each pulse transformer has a 1:1 turns ratio and is wound around an electrically conductive core made of 50% nickel and 50% iron. Because the core is electrically conductive in this embodiment, the primary and secondary windings are insulated from the core and each other. According to another specific embodiment, diodes D1 through Dn each comprise an MUR420 from Motorola.

The pulse transformer primaries are connected in series with a primary switch which, according to a specific embodiment, comprises a plurality of MOSFETs Q3 through Q12 arranged in parallel. According to a more specific embodiment, MOSFETs Q3 through Q12 each comprise an IFXH12N100 from IXYS Corporation of San Jose, Calif. The primary switch is used to control the flow of current through the primary winding of the pulse transformer as dictated by the drive signal from gate signal source G1 via transistors Q1 and Q2 which are arranged, as shown, in a push-pull class B complementary amplifier configuration. According to a specific embodiment, transistors Q1 and Q2 comprise a D44VH10 and a D45VH10, respectively, from Motorola.

In operation, MOSFETs Q3 through Q12 are turned on by gate signal source G1 via transistors Q1 and Q2 thereby drawing current from voltage source V1 through the primary windings of T1 through Tn. Energy is stored in the cores of transformers T1–Tn as represented by the current ramping up in the primary windings. When MOSFETs Q3 through Q12 are turned off by gate signal source G1, the energy stored in the cores of T1–Tn is commutated to the gates of thyristors THY1 through THYn via the corresponding secondaries of T1–Tn and diodes D1 through Dn in the form of a current pulse.

According to various specific embodiments, the shape of the current pulse delivered by the secondaries of T1 is manipulated to suit the requirements of the devices being switched and the particular application. That is, the L/R time constant of the secondary windings are selected such that the decay rate of the secondary current pulses are appropriate for both the device being switched and the application. For example, according to a particular embodiment, the devices being switched at the secondary of the transformer require a relatively flat current pulse for more than 2 us at a repetition rate of 500 Hz. Thus, the L/R time constant of the secondaries are selected such that the current pulses decay at the slowest rate possible while still approaching zero before the next current pulses are required, i.e., before 2 ms elapses. This achieves a relatively flat pulse over the first several microseconds. It will be understood that for devices which do not require a very flat current pulse, much higher repetition rates may be achieved. It should also be pointed out that there is a tradeoff between the rise time (di/dt) of the current pulses and the decay rate.

While the invention has been particularly shown and described with reference to specific embodiments thereof, it will be understood by those skilled in the art that changes in the form and details of the disclosed embodiments may be made without departing from the spirit or scope of the invention. For example, the embodiment shown in and described with reference to FIG. 1 shows a stack of thyristors. It will of course be understood that the number of devices, n, may comprise a wide range of integers including one device. In addition, the gate driver of the present invention may be used in a variety of applications, being particularly useful in applications requiring high current pulses with fast rise times. One such application is described in the commonly assigned, copending application incorporated by reference above. Another application for which the present invention can prove beneficial is a hard switched modulator.

Figure 2:
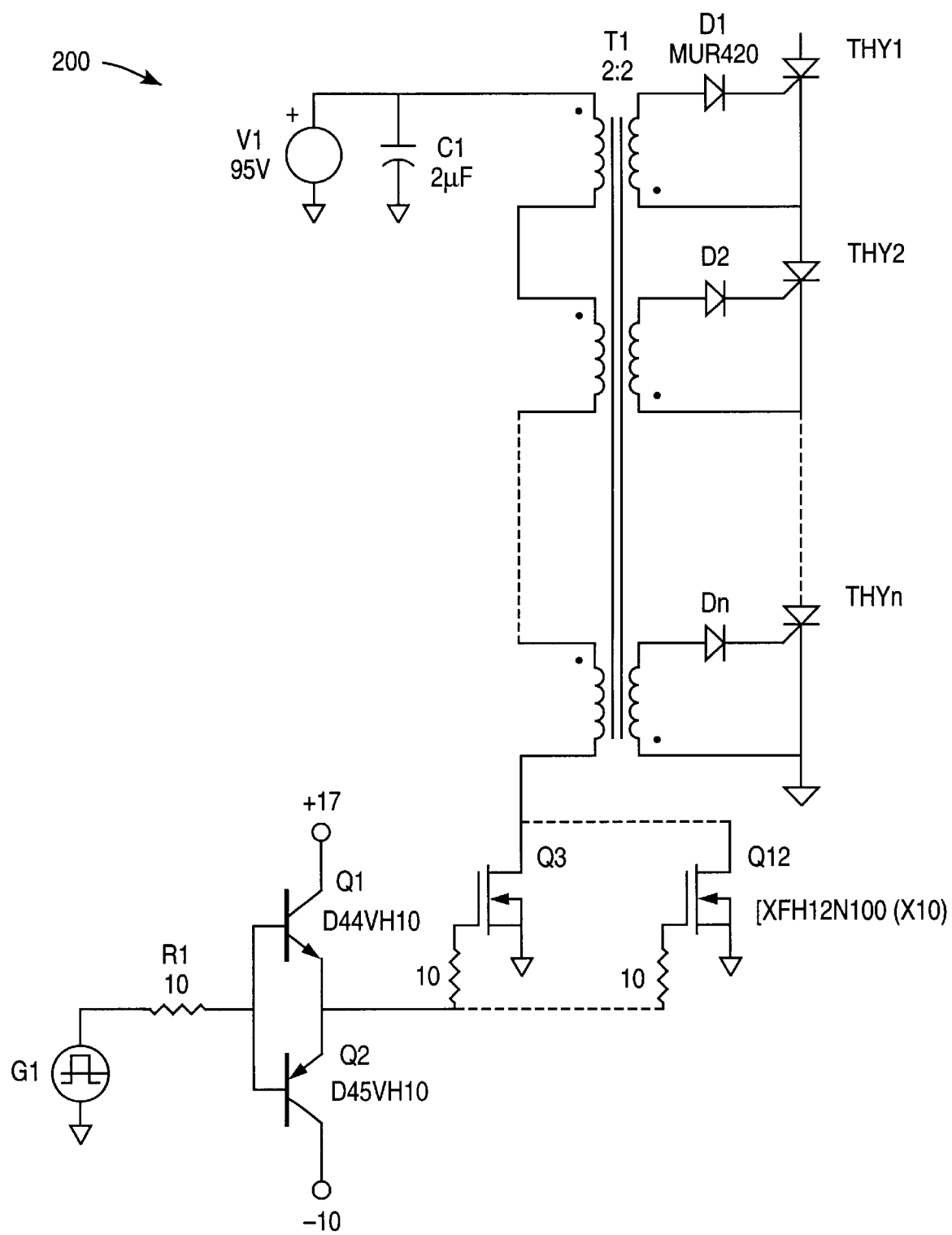
FIG. 2 is schematic of a gate drive circuit designed according to another specific embodiment of the invention.

It should also be noted that other changes to the circuit configuration of FIG. 1 may be made without departing from the scope of the invention. For example, although FIG. 1 shows multiple transformers stacked in series to accommodate multiple switches, it is also possible to employ a single pulse transformer T1 with multiple secondaries as shown in gate drive circuit 200 of FIG. 2. Such an approach may be attractive where, for example, a small number of series switches are used.

Figure 3:
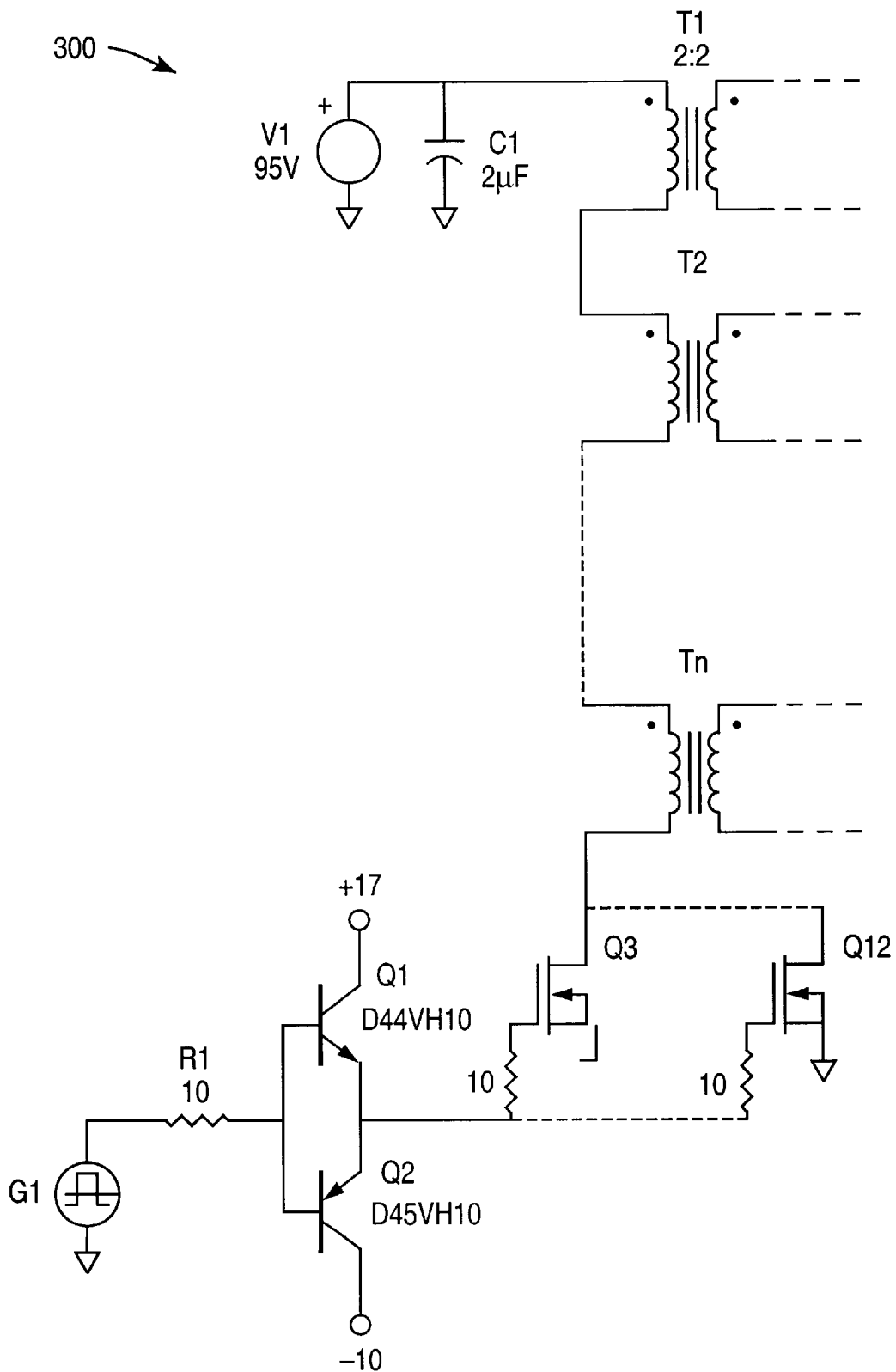
FIG. 3 is a schematic of a gate drive circuit designed according to different embodiment of the invention.

As another example of an alternative configuration, even though the pulse transformers T1–Tn of FIG. 1 are shown as inverting transformers (in that the secondary windings are wound opposite the primary windings), it will be understood that the gate drive circuit of the present invention may be implemented using one or more non-inverting transformers, i.e., a transformers in which the primary and secondary windings are wound in the same direction (see gate drive circuit 300 of FIG. 3). In addition, the switch comprising MOSFETs Q3 through Q12 may be any of a variety of switch types (including both semiconductor and vacuum tube technology) and may comprise a plurality of devices (as shown) or a single device. Moreover, the push-pull gate drive amplifier of FIG. 1 is not required for implementation. That is, a variety of techniques may be employed to amplify and/or provide the drive for turning the primary current switch on and off. Therefore, the scope of the invention should be determined with reference to the appended claims.

What is claimed is:

1. A circuit for providing gate drive to a gate terminal of a first switching device, comprising:

a transformer having a core, a primary winding, and at least one secondary winding, the primary winding for coupling to a power source, and the at least one secondary winding for coupling to the gate terminal of the first switching device;

a second switching device connected in series with the primary winding of the transformer for controlling conduction of current in the primary winding, the current causing energy to be stored in the core of the transformer, the second switching device being operable to stop the current from flowing in the primary winding thereby causing a current pulse to be generated in the at least one secondary winding from the energy stored in the core, the current pulse being for driving the gate terminal of the first switching device.

2. The circuit of claim 1 wherein the transformer comprises a plurality of secondary windings for coupling to gate terminals of a plurality of first switching devices, and wherein a plurality of current pulses are generated for driving the gate terminals, one of the current pulses being generated in each of the plurality of secondary windings.

3. The circuit of claim 1 wherein the primary winding and the at least one secondary winding of the transformer are wound in opposite directions.

4. The circuit of claim 1 wherein the primary winding and the at least one secondary winding of the transformer are wound in the same direction.

5. The circuit of claim 1 wherein the second switching device comprises a plurality of MOSFETs in parallel.

6. The circuit of claim 1 further comprising a diode interposed between one end of each of the at least one secondary winding and the gate terminal.

7. The circuit of claim 1 further comprising a gate drive amplifier for providing a gate drive signal to control operation of the second switching device.

8. The circuit of claim 7 wherein the gate drive amplifier comprises a push-pull configuration, class B amplifier.

9. A circuit for simultaneously providing gate drive to a plurality of gate terminals of a plurality of first switching devices, comprising:

a transformer having a core, a primary winding, and a plurality of secondary windings, each secondary winding corresponding to one of the plurality of first switching devices, the primary winding for coupling to a power source, and each secondary winding for coupling to the gate terminal of the corresponding first switching device;

a second switching device connected in series with the primary winding of the transformer for controlling conduction of current in the primary winding, the current causing energy to be stored in the core of the transformer, the second switching device being operable to stop the current from flowing in the primary winding thereby causing a current pulse to be simultaneously generated in each of the secondary windings from the energy stored in the core, the current pulses being for driving the gate terminals of the plurality of first switching devices.

10. A circuit for simultaneously providing gate drive to a plurality of gate terminals of a plurality of first switching devices, comprising:

a plurality of transformers each having a core, a primary winding, and a secondary winding, each secondary winding corresponding to one of the plurality of first switching devices, the primary windings for coupling to a power source, and each secondary winding for coupling to the gate terminal of the corresponding first switching device;

a second switching device connected in series with the primary windings of the transformers for controlling conduction of current in the primary windings, the current causing energy to be stored in the cores of the transformers, the second switching device being operable to stop the current from flowing in the primary windings thereby causing a current pulse to be simultaneously generated in each of the secondary windings from the energy stored in the cores, the current pulses being for driving the gate terminals of the plurality of first switching devices.

11. A method for providing gate drive to a gate terminal of a first switching device using a circuit comprising a transformer having a core, a primary winding, and at least one secondary winding, a power source being coupled to the primary winding of the transformer, the circuit also comprising a second switching device connected in series with the primary winding of the transformer, the method comprising:

operating the second switching device to cause current to flow in the primary winding of the transformer, the current causing energy to be stored in the core of the transformer; and operating the second switching device to stop the current from flowing in the primary winding of the transformer, thereby causing a current pulse to be generated in the at least one secondary winding from the energy stored in the core, the current pulse being for driving the gate terminal of the first switching device.

* * * * *